United States Patent [19]
Rapeli et al.

[11] Patent Number: 5,270,666
[45] Date of Patent: Dec. 14, 1993

[54] METHOD AND CIRCUITRY FOR DEMODULATION OF ANGLE MODULATED SIGNALS BY MEASURING CYCLE TIME

[75] Inventors: Juha Rapeli; Timo Rahkonen; Juha Kostamovaara, all of Oulu, Finland

[73] Assignee: Nokia Mobile Phones, Ltd., Salo, Finland

[21] Appl. No.: 915,230

[22] Filed: Jul. 16, 1992

Related U.S. Application Data

[63] Continuation-in-part of Ser. No. 632,393, Dec. 14, 1990, abandoned.

[30] Foreign Application Priority Data

Dec. 22, 1989 [FI] Finland ........................... 896267

[51] Int. Cl.⁵ .............................................. H03D 3/00
[52] U.S. Cl. ..................................... 329/341; 329/342; 329/343; 329/345; 375/82; 375/94
[58] Field of Search ............... 329/341, 342, 343, 345; 375/80, 82, 94, 95; 455/214

[56] References Cited

U.S. PATENT DOCUMENTS

| | | |
|---|---|---|
| 3,548,328 | 12/1970 | Breikss . |
| 3,971,998 | 7/1976 | Gopinath et al. ................ 328/167 |
| 4,368,434 | 1/1983 | Miller et al. ..................... 329/343 |
| 4,567,442 | 1/1986 | Haussmann ...................... 329/341 |
| 4,593,266 | 6/1986 | Palmer .............................. 328/112 |

FOREIGN PATENT DOCUMENTS 63-267005 11/1988 Japan .
2204201 5/1988 United Kingdom .

OTHER PUBLICATIONS

Chu: Phase digitization sharpens timing measurements, IEEE Spectrum, Jul. 1988, pp. 28–32.

Rahkonen, T., Time interval measurements using integrated tapped CMOS delay lines, pp. 202–205, Proc. 32nd Midwest Symposium on Circuit and Systems, Urbana, Ill., USA, Aug. 1989.

Rahkonen, T., The use of CMOS ASICs in applications requiring high timing accuracy, Licentiate Thesis, University of Oulu, Finland, Aug. 1990.

*Primary Examiner*—Siegfried H. Grimm
*Attorney, Agent, or Firm*—Darby & Darby

[57] ABSTRACT

An FM or PM signal is demodulated so that the cycle time of the modulated input signal is measured using a time-to-digital converter comprising a counter that uses a moderate clock frequency as a reference clock, a digital delay line interpolator and a control circuitry. The counter is used for rough digitization and the delay line for interpolating the moment of zero-crossing inside a clock cycle. Total delay of the delay line, i.e., the range of time intervals the interpolator is able to measure, is actively kept equal to the cycle time of the reference clock. When the number of delay elements in the delay line is a power of two, the result of the delay line interpolator may be used directly as the least significant bits of the measurement.

20 Claims, 5 Drawing Sheets

METHOD AND CIRCUITRY FOR DEMODULATION OF ANGLE MODULATED SIGNALS BY MEASURING CYCLE TIME

This application is a continuation-in-part of application Ser. No. 632,393, filed on Dec. 14, 1990 and now abandoned.

The object of this invention relates to a device capable of demodulating a frequency or phase modulated (i.e. angle modulated) signal from a ratio frequency (RF) or intermediate frequency (IF) carrier. The device has accurately predetermined, non-drifting transfer characteristics, and its operation is based on measuring the instants of the rising edges of the signal with high (sub-nanosecond) resolution and on keeping power consumption low.

PRIOR ART

It is prior known to demodulate angle (frequency or phase) modulated signals in several different ways. The most usual means for said demodulation are phase-locked loops (PLLs), quadrature detectors, or, when the modulation is slow enough, frequency counters.

A phase locked loop is a non-linear, closed-loop system. The optimization of its characteristics is limited by the stability of the feedback loop, which inherently has at least one integrating term. Digital phase-locked loops require a high clock frequency compared to the frequency of the input signal, while analog realizations consume DC bias current, both comsuming too much power to be used in a battery-powered system.

The commonly used quadrature detector is based on a tuned resonant circuit which is used to cause a frequency dependent phase shift in the signal. Quadrature detectors are also non-linear, causing a difficult design tradeoff between sensitivity and linearity, and the active components and the resonant circuits needed for said detectors are expensive and difficult to use due to individual variations and temperature dependence.

One realization of frequency demodulation is presented in Ref. [1] (Haussmann, U.S. Pat. No. 4,567,442). In Ref. [1], the instantaneous amplitude of the angle modulated signal is sampled with an A/D-converter, and digitally delayed samples are selectively summed to get two amplitude values, the ratio of which is proportional to the instantaneous frequency. This method has the disadvantage, that it requires a high-speed and power consuming A/D converter and arithmetic computations for dividing two numbers.

It is commonly known to use time interval measurements for measuring static or slowly modulated frequencies. In these applications, the frequency is generally measured using a digital frequency counter having an internal reference oscillator and a counter that counts the cycles of the reference oscillator during the time between two (or more) successive zero crossings of the signal to be measured. In Ref. [2] (Chu, IEEE Spectrum, July 1988) a device (HP5371A) for measuring angle modulation is presented, but it uses such a high clock frequency and consumes so much power that the principle is impractical for hand-held applications. A device based on a similar principle is presented in Ref. [3] (Breikks, U.S. Pat. No. 3,548,328), which device also needs a very high clock frequency. An advantage of these two devices (and all the following ones) is that only zero-crossing information is used and the demodulated signal is automatically converted to digital, so that no separate A/D converter is needed.

The resolution of time interval measurements can be improved with various interpolation techniques, so that the same resolution can be achieved with lower clock frequency (or without a clock signal at all). One way of increasing the resolution while keeping power consumption very low is to use as an interpolator an integrated, tapped delay line comprising of CMOS logic gates. In Ref. [4] (Palmer, U.S. Pat. No. 4,593,266) an integrated, tapped delay line is used for delaying the edge of the signal to be detected, and cycle time is found as a coincidence of the delayed edge and the next edge. This scheme is however impractical for the following reasons. Firstly, when frequency deviation is small (e.g. $+/-5$ kHz in a 455 kHz intermediate frequency (IF) signal in mobile communication systems), a very long delay line is needed. A 1000 taps long delay line, for example, would give only about $+/-10$ quantization levels of the modulation, and using present technology, such long delay lines are not linear enough for practical applications without trimming. Secondly, Palmer's coincidence logic relies on the idea, that the width of the pulse remains constant in the delay line, which is very difficult to achieve especially if the delays also need to be controllable.

A demodulation method that combines the usage of a tapped delay line and a clock signal is presented in Ref. [5] (Hayashi, Japanese pat. JP 63-267005), where the FM signal propagates in a delay line comprising CMOS buffers, and the clock signal is used to latch the phase of the signal at every rising clock edge. Two successively latched phase measurements are used to interpolate the time when the signal edge crossed the midpoint of the delay line. Due to the interpolation formulaes used, the unit delays in the delay line need not to be (and are not) calibrated to any specific value, but also this scheme has some features that make it impractical. First, the total delay of the delay line needs to be at least two clock cycles which makes the delay line unnecessarily large. Secondly, because the measurement range of the interpolator is not fixed, every result must be scaled requiring at least three additions and one division for every detected zero-crossing. These hardware-consuming real-time computations and the large size of the interpolator make this realization impractical.

Another combination of a frequency counter and a short (8 taps long) interpolating delay line is presented in Ref.[6] (Nikolaev, British patent appl. GB 2,204,201). However, neither realization nor calibration method for the interpolator is given, and the schematics given (FIG. 3 in Ref.[6]) suggest, that a startable high-frequency oscillator would be needed, which usually is very difficult to realize. In order to get adequate resolution, the input signal is first rectified to double the deviation of the FM signal and then divided to a much lower frequency, the cycle time of which can be measured. Although deviding input frequency by a factor of M makes the time measurements much easier, a lot of information about the signal is lost (as only every Mth edge is detected), and especially when the signal is noisy, this method has found to give worse detection than a system, where time between each zero crossing can be measured.

The present invention relates to a device, with which both ac and dc information in a frequency or phase modulated signal can be demodulated digitally using time interval measurements, but without the need for a high-frequency oscillator or unpractically long delay line. The device includes no feedback loop that contains the input signal, so there are no stability limitations for the means (e.g. digital filters that often have long processing delays) that can be used to improve the quality of the detected signal. The invented device is easy to integrate and manufacture and contains no parts that need trimming.

SUMMARY OF THE INVENTION

In the device according to the present invention, an angle modulated (FM or PM) signal is demodulated so that the cycle time of the modulated input signal is measured using a time-to-digital converter comprises a counter that uses a moderate clock frequency (5..30 MHz, called the reference clock fref), a digital delay line interpolator and a control circuitry. The counter is used for rough digitization and the delay line for interpolating the moment of zero-crossing inside the clock cycle. Total delay of the delay line (i.e. the range of time intervals the interpolator is able to measure) is actively kept equal to the cycle time of the reference clock, and when the number of delay elements in the delay line is a power of two (most suitably 32, 64 or 128), the result of the delay line interpolator can be used directly as the least significant bits of the measurement. The main difference between the device in Ref. [5], which also employs a digital delay line interpolator, and the present invention is that in the device according the present invention the interpolating range of the delay line (i.e. the the longest time interval the interpolator can measure) is fixed to equal one clock cycle, and this feature reduces the size of the demodulator, greatly simplifies the combining of the results of the interpolator and the counter and makes the resolution of demodulator insensitive to the variations in ambient conditions. In contrast to Ref. [6] (Nikolaev), the devive according to the present invention is capable for measuring the timing of every positive (or negative) zero-crossing of the IF signal, which reduces aliased noise (important especially when the signal level is low) and allows the demodulation of higher modulating frequencies.

In a typical mobile communication system, an IF carrier of 455 kHz has a frequency modulation of +/−5 kHz. Thus a 0.5..1 ns measurement resolution is needed to distinguish the modulation in one period of the IF signal. Nanosecond taps in a delay line are easy to realize using present CMOS logic gates, and cascoding e.g. 128 of them is enough to allow the reference frequency (the cycle time of which is equal to the total delay of the delay line) to be about 10 MHz, which is easily generated (and often available in mobile telecommunication systems) and low enough to keep power consumption down. Thus sub-ns resolution is achieved using a relatively low frequency counter and a delay line interpolator of moderate size.

The measured cycle time of the FM signal can be converted to frequency deviation e.g. by using a look-up-table technique as described e.g. in Ref.[3]. The frequency deviation df can also be calculated from the difference dT between measured cycle time and the cycle time of the center frequency fo of the FM signal:

$$dT = 1/(fo+df) - 1/fo, \quad (1)$$

resulting in $$df = -dT \cdot fo \cdot fo/(1 + fo \cdot dT). \quad (2)$$

from which $$df \approx -dT \cdot fo \cdot fo, \text{ when } df < < fo \quad (3).$$

If the frequency deviation df is small compared to the center frequency fo, the time difference dT.between the measured cycle time and the cycle time of the center frequency fo can be directly used to present the frequency deviation df, as shown in Eq. 3. For example, when fo=455 kHz and df<5 kHz, the use of approximation in eq. (3) causes harmonic distortion of about −40 dB, which is acceptable for audio signals in mobile communication systems and bears no significance in digital FSK signals. Thus a lot of arithmetics (or the usage of a look-up-table) can be avoided. If larger deviations need to be demodulated, linearization is easy as the form of non-linearity is exactly known.

To further simplify the demodulation hardware, the value of 1/fo in Eq.1 can be rounded to the nearest number of full clock cycles, so that the subtraction can be done by initializing the counter with an integer value NO=−ROUND(fref/fo) after each measurement. Substituting 1/fo in Eq.1 with NO/fref, Eq.4 with a constant DC value (fref/NO−fo) results. This offset-value (fref/NO−fo) depends only on fref and fo, so it can be used to monitor the changes in received carrier center frequency fo. For ac signal detection, said offset value can easily be subtracted or filtered out.

$$df = ((fref/NO - fo) - dT \cdot fo \cdot (fref/NO))/(1 + dT \cdot fref/NO) \quad (4)$$
$$\approx (fref/NO - fo) - dT \cdot fo \cdot (fref/NO)$$

In phase modulated signals, the change of phase dphi during one cycle of an IF signal is approximately $2 \cdot pi \cdot df \cdot (1/fo)$, resulting in cumulative phase phi $$phi \approx -2 \cdot pi \cdot \Sigma((fref/NO/fo - 1) - dT \cdot (fref/NO)), \quad (5)$$

where dT, fref, NO and fo are as defined previously. Phase modulation can thus be demodulated by integrating values dT, but now the DC term (fref/NO/fo−1) must be included before integration to avoid a constantly growing phase error that would otherwise exist, due to different time bases of the received signal and the detector.

Finally, when the signal to noise ratio of the received signal is good, power can be saved by measuring the accurate timing of the zero-crossing of the IF signal only at every Mth (decimation ratio M is an integer >1) positive zero-crossing of the IF signal. This increases dT to M-fold (dT=M/(fo+df) −M/fo) thus reducing quantization effects, but it also reduces the sampling rate to fo/M, which makes the aliasing of the input noise to a more severe problem. Thus a possibility to change the decimation ratio M in a fast and easy way helps to improve the quality of the received signal in changing conditions.

DESCRIPTION OF THE DRAWINGS

The invention is described in more detail below with reference to the enclosed figures clarifying the invention.

DETAILED DESCRIPTION OF THE INVENTION

Figure 1:
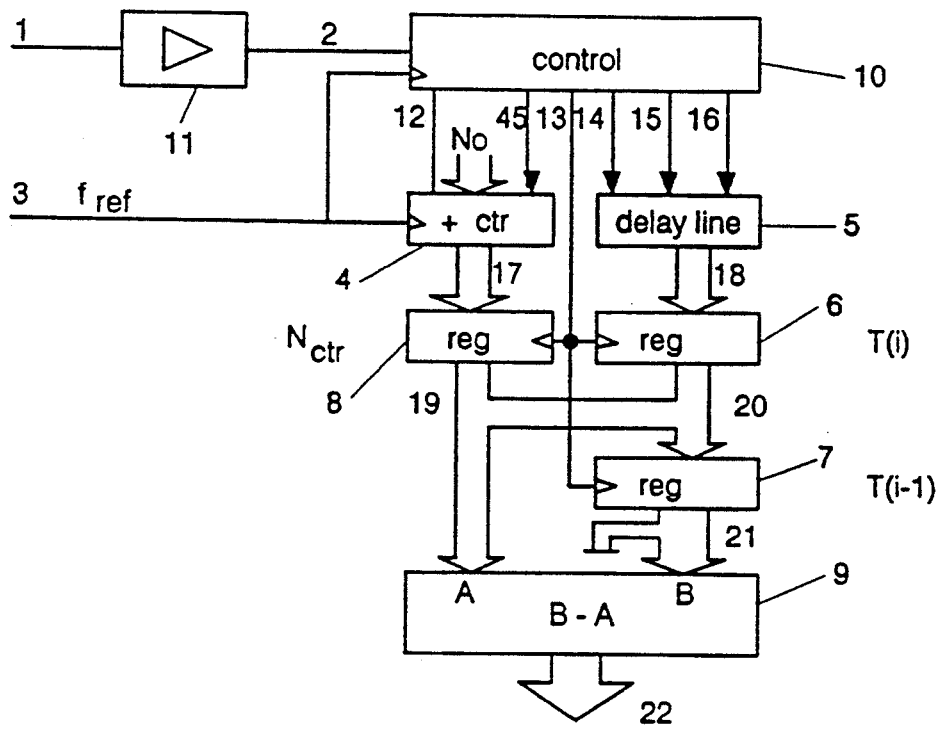
FIG. 1: Schematic of the device according to the invention.
Figure 2:
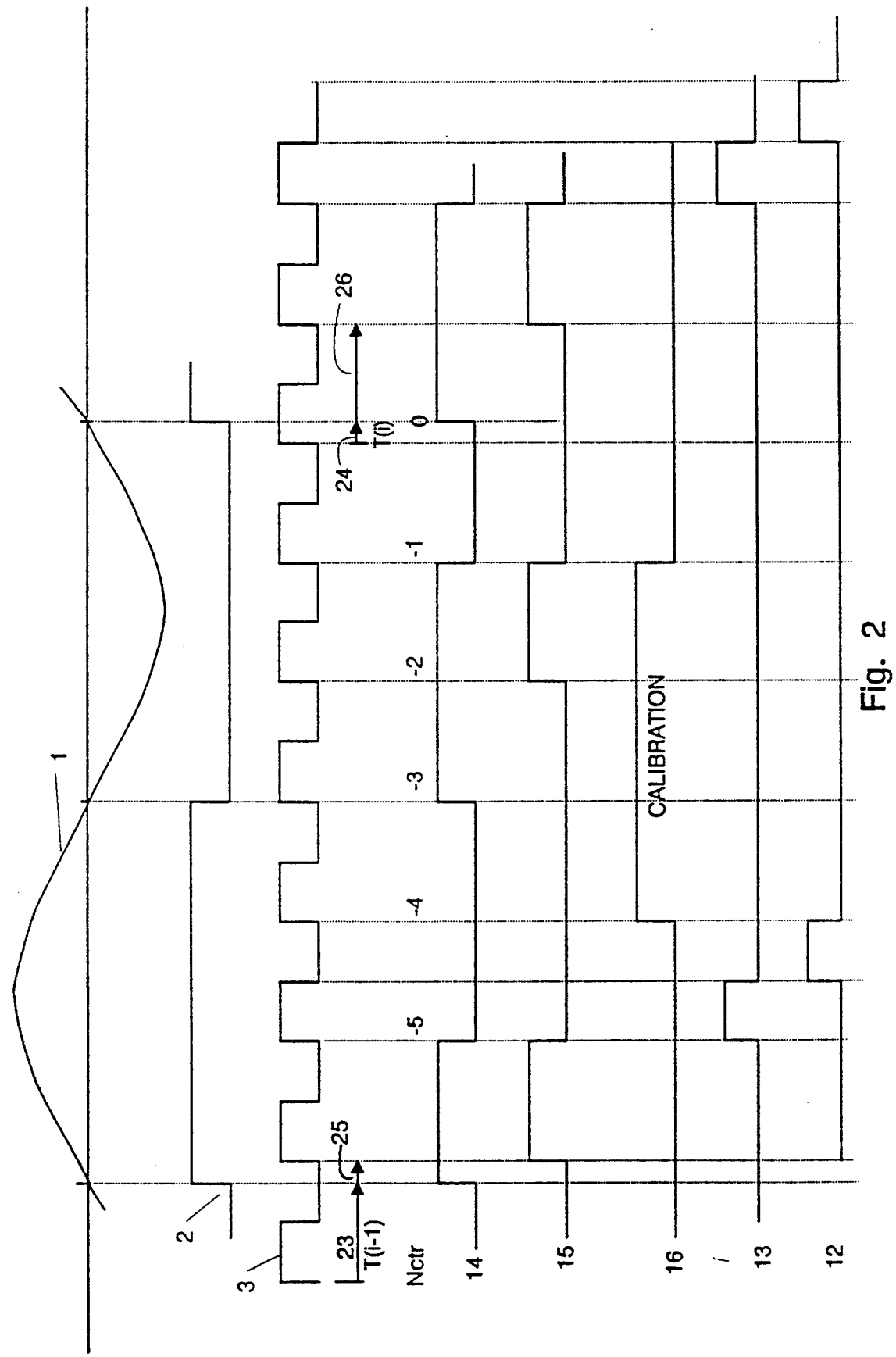
FIG. 2: Timing diagram.

FIGS. 1 and 2 illustrate the detection of an analog input IF signal 1. The input signal 1 is converted to a logic level signal 2 with a limiting amplifier 11. From logic level signal 2 a control circuit 10 generates signal 45 to enable an up-counter 4 that digitizes roughly the time between two rising (or falling) edges of signal 2 by counting the number of full cycles of a reference clock 3, and signals 14 and 15 that are used in a delay line interpolator 5 to more accurately digitize the time fractions $T(i-1)$ and $T(i)$ (23 and 24 in FIG. 2) from the previous fref rising edge to the rising edge of signal 2. In practice it is easier to measure times 25,26 from the rising edge of IF signal 2 to the following edge of the reference clock 3, but as the total delay of the interpolating delay line is equal to the cycle time of the clock frequency, the output of the interpolator can easily be coded to present time 23,24 from the previous clock edge to the rising edge of the input signal. Thus, the cycle time Ts of the input signal 2 is $$Ts = N \cdot Tref + T(i) - T(i-1), \quad (6)$$

where N is the number of full clock cycles between two rising edges of amplified IF signal 2 and Tref is the cycle time of the reference clock 3. As stated earlier, the cycle time of the center frequency fo can be approximately substracted from cycle time Ts of the signal by initializing the counter after each measurement with such a digit $NO = -ROUND(1/fo/Tref)$, that at the center frequency fo the contents Nctr of the counter will be zero by the time of the next rising edge of the signal 2, as shown in FIG. 2 (In practice, counter 4 may be stopped for a few clock cycles using signal 45 for reading and initializing its contents. In this case the initial value NO must be some digits larger). Thus, $$dT = Nctr \cdot Tref + T(i) - T(i-1) \quad (7)$$

and $$df \approx (fref/NO - fo) + fo \cdot (fref/NO) \cdot (T(i-1) - Nctr \cdot Tref - T(i)) \quad (8)$$

Neglecting the offset term (fref/NO−fo), the calculation of df (22 in FIG. 1) is realized using registers 6,7,8 in which the results $T(i)$, $T(i-1)$ and Nctr are stored at the rising edge of a control signal 13, and a substractor circuit 9. The argument A of the subtractor consists of Nctr (19) as the most significant bits and $T(i)$ (20) as the least significant bits, and argument B is $T(i-1)$ (21) with the most significant bits connected to logical zero. The result df (22) is a digit that can be either positive or negative, but the initial value NO of the counter can be changed to shift the result df (22) to be entirely positive, if needed for a digital-to-analog conversion, for example. This way only very simple arithmetic hardware is needed, if the small distortion due to approximation in Eq.3 (which is realized by the invention shown in FIG. 1) is approvable. If the distortion is found to be too large, a small look-up-table or other well known linearization means can be used to correct the results 22.

The control circuit 10 in FIG. 1 operates as follows. For measuring time fractions $T(i)$ and $T(i-1)$, timing signals 14 and 15 (timing sequences shown in FIG. 2) for the delay line interpolator 5 are generated from the rising edge of the input signal 2 and from the next rising edge of the reference clock 3, respectively. Controller 10 stores the new results Nctr 19 and $T(i)$ 24 in registers 8 and 6 by giving a control signal 13 (which also moves the previous $T(i)$ from register 6 to $T(i-1)$ in register 7). After that counter 4 is initialized with contents NO by giving signal 12 and enabled with signal 45, to be stopped again for new reading and initialization at next rising edge of signal 2. If the sampling rate of frequency measurements needs to be reduced e.g. to decrease power consumption, control logic 10 may include a divide-by-M decimation counter, which enables the timing and storing signals 12-15, 45 only at every Mth rising edge of signal 2. The decimation ratio M and the initial value NO of the counter 4 can also be programmable.

The operation sequence of the controller also includes a calibration sequence, that is interleaved between two successive measurements as shown in FIG. 2 by signal 16. In the calibration sequence calibration enable signal 16 is activated, register load signal 13 is disabled and timing signals 14 and 15 are generated from two successive edges of the reference clock 3, and their difference (i.e. the period of the reference clock) is used to calibrate the length of the delay line.

Figure 3:
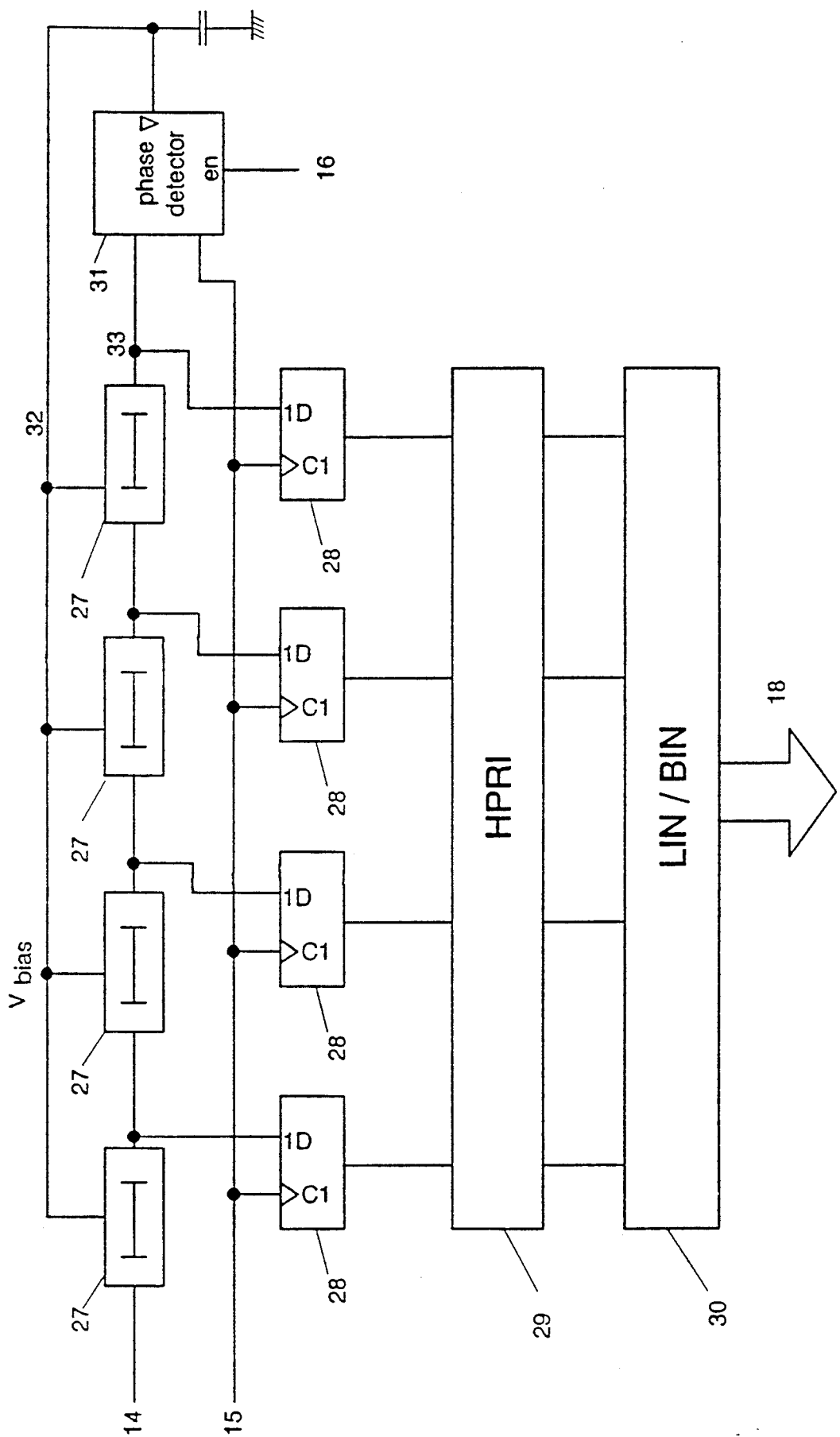
FIG. 3: Schematic of the delay line interpolator.

The schematic of the delay line interpolator is shown in FIG. 3. The delay line comprises of several (e.g. 32 or 64) delay elements 27, in which the rising edge of signal 14 starts to propagate at the same time as the input signal 2 rises. The state of the delay line is latched into memory elements 28 with signal 15, which occurs at the next rising edge of the reference clock 3. Further, the position of the first flip-flop 28 not set by the propagating signal 14 is converted to a binary number representing time $T(i)$ (22) by priority 29 and linear-to-binary 30 coding.

The delay elements can be for example a pair of CMOS logic inverters with one additional series transistor, the gates of which (and thus the output currents of the inverters) are controlled with a bias voltage 32. The bias voltage 32 is updated using a phase detector 31, the output of which is normally in a high-impedance state but is enabled for calibration with signal 16. The phase detector 31 compares the timing between the output 33 of the delay line and the strobe signal 15 which is delayed one clock cycle with respect to input 14 of the delay line, and corrects the bias voltage 32 if signals 15 and 33 are not changing state in the same time. This forms a delay-locked loop that stabilizes the gain of the delay line interpolator. As the calibration inputs 14, 15 of the feedback loop are both generated from clock signal 3, the fading of the input signal cannot cause the loop to get out of lock as happens in conventional PLL detectors.

Figure 7:
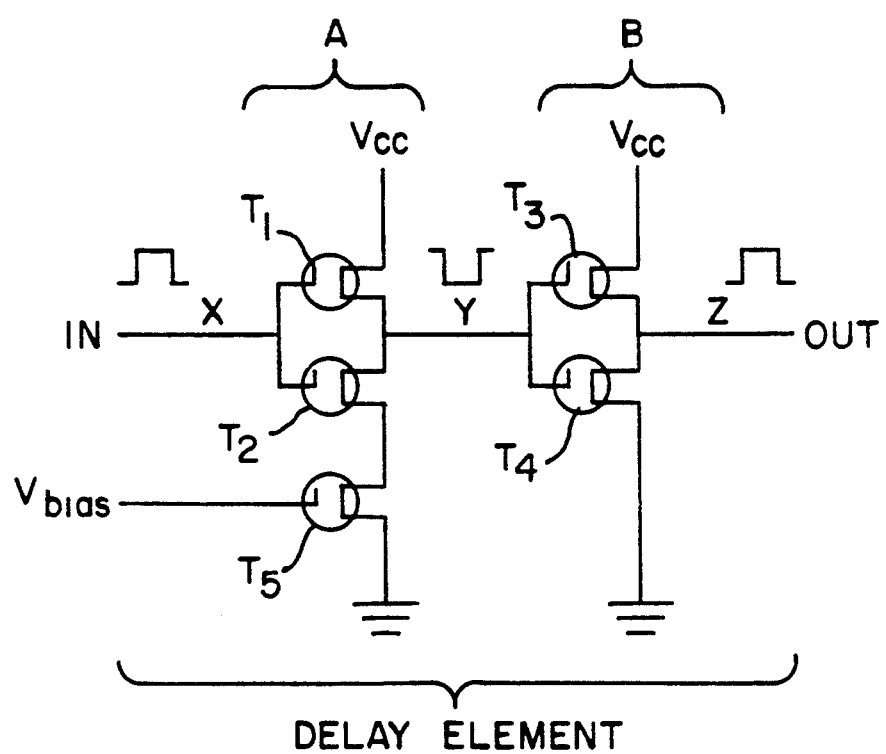
FIG. 7: Circuit schematic of a delay element of a delay line.

One possible delay element for use in a delay line is illustrated in FIG. 7. The delay element comprises two inverters, an inverter A and an inverter B. Each inverter includes two MOS-transistors, $T_1T_2$ and $T_3T_4$, respectively. MOS-transistor $T_5$, acting as a controllable resistor, is coupled in series with MOS-transistor $T_2$.

The first inverter A inverts and delays an incoming pulse x and the second inverter B inverts its incoming pulse y so that the output pulse at point z is a delayed pulse which is not inverted relative to the input pulse at x. In a tapped delay line the output pulse of a delay element is non-inverted. Consequently, any logic gate which is non-inverting and the propagation delay of which can be adjusted, may be used to provide a delay element.

Figure 4:
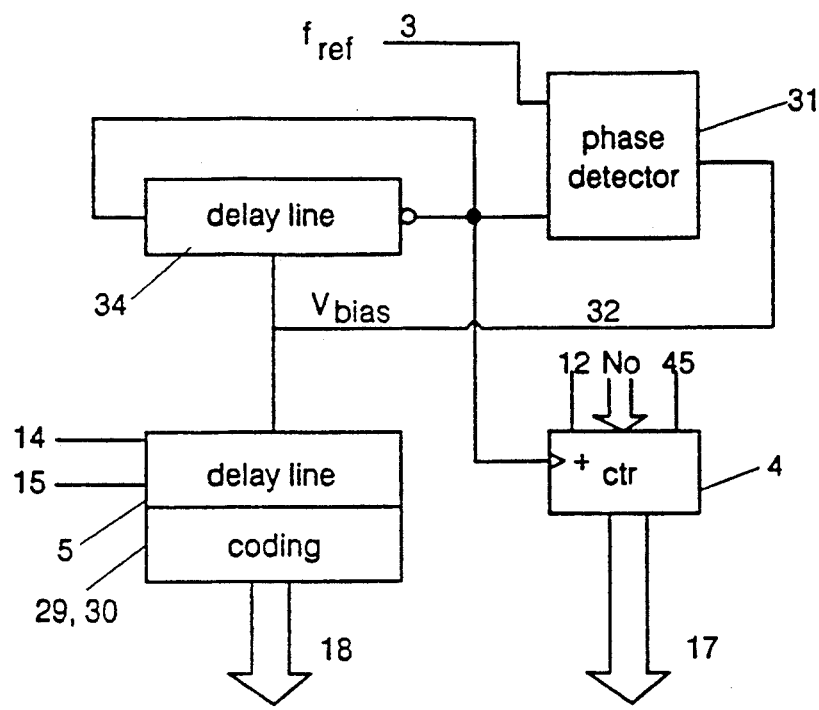
FIG. 4: Schematic of phase-lock stabilization using a delay line VCO.
Figure 5:
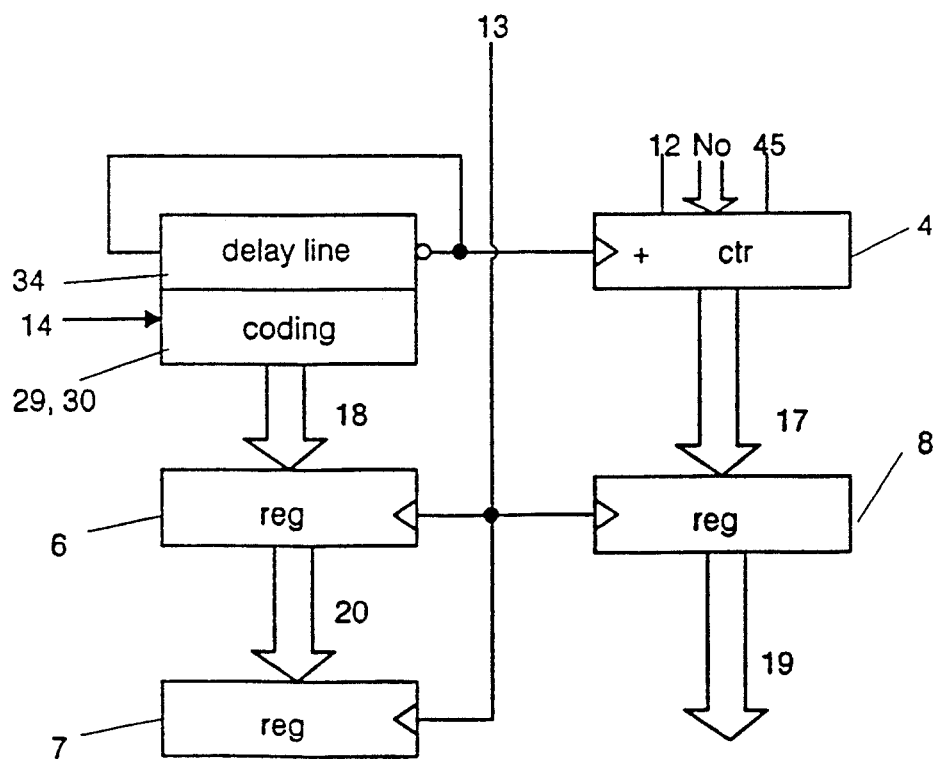
FIG. 5: Schematic of a multi-phase interpolator without a stable reference frequency.

The realization of the invention is not limited to the above example that is used only to clarify the operation of the invention. For example, if the cycle time of the input signal 1 is short, two or more delay line interpolators can be used to measure time $T(i)$ and $T(i-1)$ alternatingly so that they will have more time to settle and to be calibrated. Two other realizations that can be used at a higher input 1 frequency are shown in FIGS. 4 and 5, in which the stabilization of the delay lines is continuous and completely independent of the rate of the input signal 1. In FIG. 4, two similar delay lines 5,34 without coding and calibration electronics (29-31 in FIG. 3) are used, the first one being connected to form a voltage controlled ring oscillator 34 (by feeding its inverted output back to its input), the frequency of which is kept equal to an external reference frequency 3 by a phase detector 31, and the second delay line 5 being used as an interpolator. As delay lines 34 and 5 share the same control voltage 32, their unit delays will be equal. Another alternative, shown in FIG. 5, is to use the delay line connected to a ring oscillator 34 as a continuously running multiphase oscillator, the phase of which is latched into register 6 at every rising edge of the input signal 2. Other applications of circuits in FIGS. 4 and 5 may include the use of lower (fref/K) external frequency 3 to reduce power consumption, which can be realized by connecting a divide-by-K counter between the output of the delay line 34 and the input of the phase detector 31 in FIG. 4. The ring oscillator 34 can also be free-running (without a stabilizing feedback), as shown in FIG. 5, because the interpolating range of the delay line 34 will always be equal to one clock cycle of counter 4, as the delay line 34 is used as the oscillator generating the reference frequency 3 to counter 4. As the frequency of a free-running ring oscillator is not stable, modulation is in this case best to calculate e.g. as a difference between measured cycle times and their long term average, which removes the drifting DC level from the demodulated results.

Also the delay line interpolator 5 can be constructed in several ways described e.g. in Ref. [7] (Rahkonen: Time interval measurements using integrated tapped CMOS delay lines, Proc. IEEE MWSCS89). For example, the area of the delay line can be reduced by realizing it by RS-flip-flops which asynchronously set each other, so that separate memory elements 28 are not needed. Usually, only leading edges will be used for timing in the delay line to avoid pulsewidth dispersion and crosstalk, but different rise and fall delays of the delay elements 27 can also be exploited to get a behaviour similar to Vernier interpolation: when trailing edge of an input pulse travels slightly faster than leading edge in the delay line, the width of the pulse (which is to be measured) is decremented in each element by the difference t(lead)-t(trail). This decrement is used as a time base by detecting the position of the delay element in which the width of the propagating pulse goes to zero, and that difference can be made smaller than minimum propagation delays in a given technology, making the timing resolution and control characteristics of a pulse-shrinking delay line better than in a traditional delay line consisting of propagation delays. This pulse-shrinking delay line can be used as an interpolator by converting the times $T(i)$, $T(i-1)$ to timing pulses the width of which is equal to the times $T(i)$, $T(i-1)$ and detecting the position of that delay element in the pulse-shrinking delay line in which the the width of the timing pulse has reduced to zero. The interpolating range of the pulse-shrinking delay line can be stabilized by sending a pulse of width Tref (the cycle time of the reference clock) to the pulse-shrinking delay line and adjusting the leading edge delay t(lead) of the delay elements so that the width of the timing pulse reduces to zero in the last delay element of the pulse-shrinking delay line. All the mentioned delay line structures have been found to be realizable and functional, and a more detailed discussion of the properties of CMOS delay lines can be found e.g. in Ref.[7].

Figure 6:
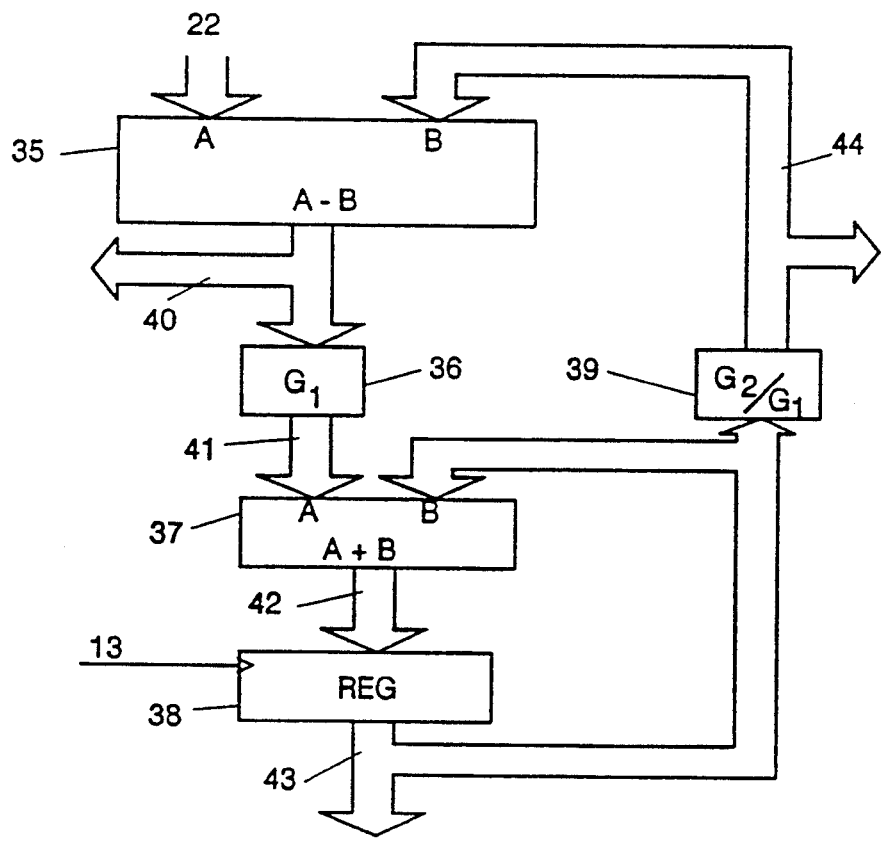
FIG. 6: Schematic of a phase demodulator.

The device according to the present invention can also be used to demodulate phase modulated signals. FIG. 6 shows an example of a simple digital filter (with finite DC gain) which consists of an integrator (performed by adder 37 and register 38), the output 43 of which is attenuated by gain G2/G1 in multiplier 39 and subtracted from its input 22 using adder 35. Standard integral transforms (Z or Laplace transform) can be used to calculate the frequency response in the outputs of the circuit. Output 44 is the low-pass filtered DC value of inputs 22 that can be used to monitor the drift of the center frequency. Subtraction of the DC value using adder 35 results in a high-pass filtered signal 40 which can be used to present the AC modulation, and the integral 43 of AC coupled dT results can be used to present the PM demodulated result. Constants G1 and G2 in multipliers 36,39 affect the gain of the integration and the corner frequency of the low-pass and high-pass filters, respectively and they must be chosen according to signal frequencies (values in powers of 2 are favoured because they result in a simpler realization).

The example above was only for illustrating a simple hardware that can perform all functions needed in a complete FM/PM demodulator. In addition to circuit in FIG. 6 (or another realization performing the functions needed in a particular application), the demodulator according to the present invention can include any linear or non-linear signal processing operations that are found to be useful in improving the quality of the demodulated signal. As stated earlier, there is no feedback loop containing the signal that would limit the methods (i.e. processing time) that can be used to filter out noise and interference.

REFERENCES

[1] Haussmann, W., U.S. Pat. No. 4,567,442
[2] Chu: Phase digitization sharpens timing measurements, IEEE Spectrum, July 1988.
[3] Breikks, U.S. Pat. No. 3,548,328.
[4] Palmer, U.S. Pat. No. 4,593,266.
[5] Hayashi, Japanese pat. 0,267,005.
[6] Nikolaev, GB pat. 2,204,201.
[7] Rahkonen, T., Time interval measurements using integrated tapped CMOS delay lines, pp. 201 Proc. 32nd Midwest Symposium on Circuit and Systems, Urbana, Ill., USA, August 1989.

What is claimed is:

1. Demodulator circuitry for demodulation of an angle modulated signal, comprising:

a time-to-digital converter for measuring the time instants of the zero-crossings of the signal, comprising a counter for counting the number of full cycles of a clock frequency occurring between zero-crossings of the signal, and at least one delay line interpolator for measuring the time between a zero-crossing of the signal and a clock edge, the interpolating range of the interpolator being equal to the cycle time of said clock frequency, comprising a tapped delay line comprising an integer number of unit delay elements, memory elements for storing the states of the delay elements, and coding circuitry to convert the states of the delay elements to a digital number proportional to the time between a zero-crossing of the signal and a clock edge, and a control circuitry for controlling the functions of said counter and said delay line interpolators and for storing the outputs of the counter and the delay line interpolators as the output of the time-to-digital converter, and means for calculating instantaneous modulation from successive outputs from the time-to-digital converter.

2. Demodulator circuitry as in claim 1 wherein the said unit delay elements in said tapped delay line in said delay-line interpolator comprise noninverting logic gates and the propagation delays of the said logic gates are used as unit delays.

3. Demodulator circuitry as in claim 1 wherein said memory elements in said delay line also contribute the unit delays of the delay elements in said delay line.

4. Demodulator circuitry as in claim 1 wherein said tapped delay line in said delay-line interpolator is a pulse-shrinking delay line, comprising logic that forms a timing pulse, the width of which is equal to the time between said zero-crossing of the signal and said edge of the said clock frequency, an integer number of delay elements having a longer delay for the leading edge than for the trailing edge of said timing pulse.

5. Demodulator circuitry as in claim 4 wherein the total interpolating range of said delay line interpolator is controllable with a delay control signal.

6. Demodulator circuitry as in claim 2 wherein the interpolating range of said delay line interpolator is stabilized by a delay-locked loop which compares the total delay of said delay line to the cycle time of said clock frequency by using a phase detector that adjusts a delay control signal applied to said delay line so that the total delay of said delay line becomes equal to the period of said clock frequency.

7. Demodulator circuitry as in claim 5 wherein the interpolating range of said pulse-shrinking delay line is stabilized by a circuitry that adjusts said delay control signal so that the width of said timing pulse, the width of which is equal to the cycle time of said clock frequency in the input of the pulse-shrinking delay line, reduces to zero in the last delay element of said pulse-shrinking delay line.

8. Demodulator circuitry as in claim 1 wherein it comprises a second similar delay line connected to form a ring oscillator, the output of which is used as said clock frequency and a delay control signal applied to the second delay line is used as a delay control signal in the first delay line which is used as an interpolator.

9. Demodulator circuitry as in claim 1 wherein said delay line is connected to form a ring oscillator the output of which is used as said clock frequency and the phase information of which is is stored at the moment of a zerocrossing of said input signal and used for interpolation.

10. Demodulator circuitry as in claim 8 wherein the frequency of the ring oscillator is stabilized by comparing it to an external reference frequency with a phase comparator that controls said delay control signal of the delay line connected to form a ring oscillator in a manner that the ring oscillator frequency will become equal to the external reference frequency.

11. Demodulator circuitry as in claim 8 wherein the frequency of the ring oscillator is stabilized by dividing said frequency by an integer number using a frequency divider, and comparing the output of said frequency divider to an external reference frequency with a phase comparator that controls said delay control signal of the delay line connected to form a ring oscillator in a manner that the ring oscillator frequency will become equal to said integer multiple of the external reference frequency.

12. Demodulator circuitry as in claim 1 wherein said control circuitry of the time-to-digital converter includes a decimation counter and logic for measuring the time instant of every Mth, where M is an integer number, zero-crossing of the input signal.

13. Demodulator circuitry as in claim 1 wherein said means for calculating the instantaneous frequency modulation comprise circuitry that calculates the difference between the measured cycle time of said input signal frequency and a constant value that is close to the cycle time of the center frequency of said input signal, this difference of cycle times being nearly linearily proportional to the value of the frequency modulation.

14. Demodulator circuitry as in claim 1 wherein the means for calculating the instantaneous phase modulation include a digital integrator, the input of which is proportional to the difference between measured cycle time of said input signal and the cycle time of the center frequency of said input signal, and the output of which is proportional to instantaneous phase modulation.

15. Demodulator circuitry as in claim 1 wherein the means for calculating the instantaneous modulation include a low-pass filter, the input of which is proportional to said difference between measured cycle time and the center frequency of the input signal, and the output of which is used to monitor drifting between the time base of the demodulator and the center frequency of the signal.

16. Demodulator circuitry as in claim 1 wherein the frequency of said clock frequency may vary and the modulation of the modulated signal is calculated by subtracting a long term average of the outputs of the demodulator from instantaneous outputs of the demodulator circuitry.

17. Demodulator circuitry as in claim 3 wherein the interpolating range of said delay line interpolator is stabilized by a delay-locked loop which compares the total delay of said delay line to the cycle time of said clock frequency by using a phase detector that adjusts a delay control signal applied to said delay line so that the total delay of said delay line becomes equal to the period of said clock frequency.

18. Demodulator circuitry as in claim 5 wherein the interpolating range of said pulse-shrinking delay line is stabilized by a circuitry that adjusts said delay control signal so that the width of said timing pulse, the width of which is equal to the cycle time of said clock frequency in the input of the pulse-shrinking delay line, reduces to zero in the last delay element of said pulse-shrinking delay line.

19. Demodulator circuitry as in claim 9 wherein the frequency of the ring oscillator is stabilized by comparing it to an external reference frequency with a phase comparator that controls a delay control signal of the delay line connected to form a ring oscillator in a manner that the ring oscillator frequency will become equal to the external reference frequency.

20. Demodulator circuitry as in claim 9 wherein the frequency of the ring oscillator is stabilized by dividing said frequency by an integer number using a frequency divider, and comparing the output of said frequency divider to an external reference frequency with a phase comparator that controls a delay control signal of the delay line connected to form a ring oscillator in a manner that the ring oscillator frequency will become equal to said integer multiple of the external reference frequency.

* * * * *